April 22, 1969 R. A. POLZL 3,440,543
DELAYED AUTOMATIC GAIN CONTROL SYSTEM
Filed Oct. 22, 1965
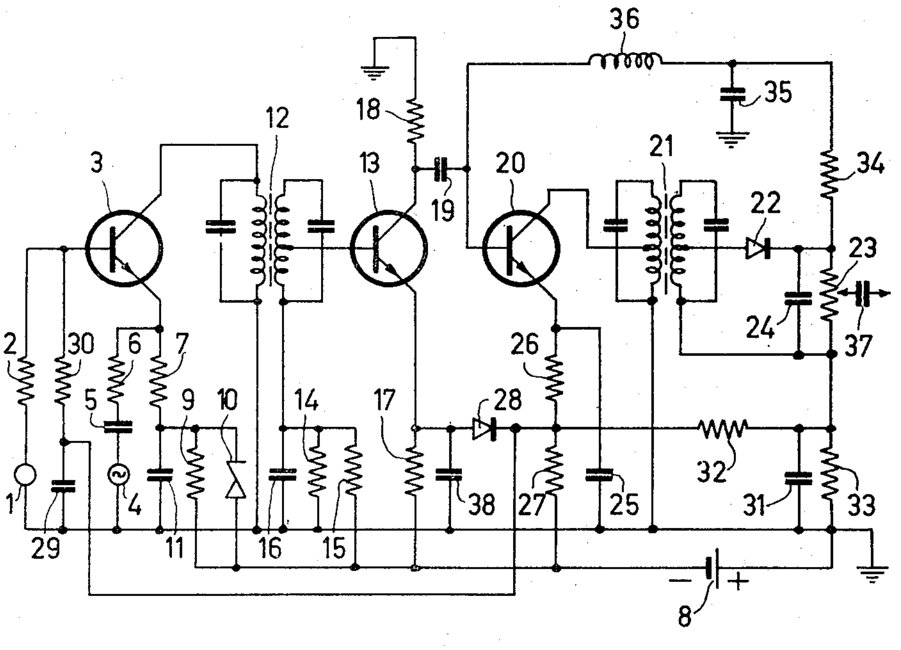
INVENTOR.
REINHARD A. POLZL
BY
Frank R. Jifain
AGENT United States Patent Office 3,440,543

Patented Apr. 22, 1969

3,440,543

DELAYED AUTOMATIC GAIN CONTROL SYSTEM

Reinhard Anton Polzl, Emmasingel, Eindhoven, Netherlands, assignor, by mesne assignments, to U.S. Philips Corporation, New York, N.Y., a corporation of Delaware Filed Oct. 22, 1965, Ser. No. 501,603
Claims priority, application Netherlands, Oct. 24, 1964, 6412422
Int. Cl. H03g *3/30;* H04b *1/16*
U.S. Cl. 325—404 10 Claims

ABSTRACT OF THE DISCLOSURE

A delayed automatic gain control system for a transistor receiving circuit comprising two amplifier transistors having their emitter circuits coupled together by a diode which is poled so as to be conductive at low signal levels. The signal detector is connected to the second amplifier transistor with such a polarity that the emitter current increases with increasing signal strength. As a consequence the emitter current and gain of the first transistor decrease with increasing signal strength. At increasing input signal levels the interconnecting diode becomes non-conductive, the gain of the first amplifier attains a stabilized value and the voltage across the emitter of the second amplifier transistor is applied to a preceding stage of the receiver.

This invention relates to transistor receiving circuits comprising a first stage, preferably an HF or mixing stage, followed by two intermediate-frequency transistors connected in cascade and then followed by a detector stage from which an automatic gain control voltage is derived which is applied to the second of the said transistors and which also acts on the first transistor through a coupling between the emitter circuits of the said two transistors.

Such receiving circuits utilize an automatic gain control in order to achieve that the output signal of the circuit is substantially constant despite great differences in the strength of the input signal applied to the circuit. However, it is also necessary to ensure that the signal-to-noise ratio is optimum under any conditions; as is well known, this may be achieved by means of a so-called delayed gain control which consists in that no gain control takes place in case of weak input signals, that the gain of a transistor present "later" in the circuit is first controlled in case of stronger input signals, and that finally, when further gain reduction in this transistor is no longer possible, the gain in a transistor present "earlier" in the circuit, preferably the input stage, is reduced.

Another problem to which attention must be paid in such receiving circuits is the handling of large input signals. In order to handle such signals without distortion input stages have been developed in which the gain control is effected by means of so-called upward control, that is the reducing of the gain by increasing the direct emitter current in the transistor either directly by control on the emitter of the transistor or indirectly by control on its base. A stage suitable especially for handling large signals comprises an upwardly-controlled mixing stage including a non-decoupled emitter resistor.

A disadvantage of such upwardly-controlled stages is, however, the high control energy which they need and which cannot usually be provided directly by the detector stage so that it is necessary to include an additional direct-current amplifier for control of the upwardly-controlled stage.

An object of the invention is to provide a circuit which utilizes delayed gain control, which circuit includes an upwardly-controlled first stage for obtaining satisfactory handling of large signals and in which additional amplifying means for providing the control energy required for the upwardly-controlled stage are avoided. The receiving circuit according to the invention is characterized in that the polarity of the detector is so chosen that the second of the said transistors is opened further upon increasing signal strength, that the coupling between the emitter circuits of the two transistors includes a diode which is cut off when a prescribed signal strength is exceeded, and that the voltage set up across an emitter resistor of the second transistor is applied to the said first stage for upward control of this stage.

In order that the invention may be readily carried into effect it will now be described in detail, by way of example, with reference to the accompanying diagrammatic drawing showing a receiving circuit according thereto.

In the figure the reference numeral 1 symbolically indicates a high-frequency signal source which may comprise, for example, an aerial. The signal source 1 is connected through a matching resistor 2 to the base of a transistor 3 which forms part of a controllable mixing stage. An oscillator voltage is applied to the emitter of mixing transistor 3 by means of a local oscillator 4 (shown symbolically) and through a coupling capacitor 5 and a non-decoupled resistor 6. The mixing transistor is fed with direct current through a non-decoupled resistor 7 and a parallel combination of a resistor 9 and a voltage-stabilising element 10, for example a Zener diode, which parallel combination is connected to a voltage source 8 and is decoupled by means of a capacitor 11.

The intermediate-frequency signal provided by the mixing transistor is applied through a transformer 12 included in the collector circuit and tuned to the said intermediate-frequency signal to the base of a first intermediate-frequency transistor 13. This base receives a constant bias by means of a voltage divider constituted by resistors 14 and 15 and connected to the voltage source 8. A capicitor 16 serves for the intermediate-frequency decoupling of the said voltage divider. The IF-transistor 13 is also provided with an emitter resistor 17, decoupled by a capacitor 38, and a collector resistor 18. The amplified intermediate-frequency signal set up across the collector resistor 18 is applied through a coupling capacitor 19 to the base of a second IF-transistor 20.

The collector circuit of transistor 20 includes a transformer 21 which is tuned to the IF-signal and through which this signal is applied to the detecting circuit constituted by a detector diode 22, a load resistor 23 in the form of a potentiometer and a detector capacitor 24 connected in parallel therewith. The emitter circuit of the second IF-transistor includes an emitter resistor decoupled by a capacitor 25 and comprising the series-combination of two resistors 26 and 27, whilst a diode 28 is included between the emitter circuits of the two IF-transistors, that is to say between the emitter of transistor 13 and the common point of the resistors 26 and 27. This common point is also connected through a decoupling capacitor 29 and a series-resistor 30 to the base of mixing transistor 3 and to a voltage divider which is decoupled by a capacitor 31 and constituted by resistors 32 and 33. The common point of the resistors 32 and 33 is connected to the lower side of the detecting circuit, and the cathode of the detector diode is connected through a resistor 34, a decoupling capacitor 35 and an IF-choke 36 to the base of the second IF-transistor 20.

The aerial signal applied through the resistor 2 to the mixing transistor is converted in it into an IF-signal by means of the oscillator voltage provided by the source 4. The said signal is subsequently amplified in the IF-amplifier, comprising the IF-transformer 12, the transistor 13, the transistor 20 and the IF-transformer 21 and then applied to the detector diode 22. The low-frequency voltage obtained by detection is derived by means of the sliding contact from potentiometer 23 and passed on through a coupling capacitor 37, for example, to a low-frequency amplifier not shown.

The delayed automatic gain control present in the illustrated circuit and serving to obtain as constant a signal level as possible at the output of the detector, whilst also the signal-to-noise ratio must be optimum, operates in the following manner.

With a very low strength of the input signal substantially no direct voltage is developed across the load resistor 23 of the detector stage. The constant base voltage for transistor 13 provided by the resistors 14 and 15, the emitter resistors 17, 26 and 27 and the voltage originating from the voltage divider 32, 33 and applied through the resistor 34 and the inductor 36 to the base of transistor 20 are chosen to be such that, with low strength of the signal, the diode 28 is conducting and the two IF-transistors 13 and 20 provide a high signal amplification; the mixing transistor 3 then also provides a high amplification.

Due to the diode 28 being conducting the resistors 17 and 27 are connected in parallel so that, at least with small input signals, the two IF-transistors have a common emitter resistance (17, 27).

The polarity of the detector diode 22 is so chosen that the second IF-transistor 20 conducts a larger current upon increasing signal. However, the voltage across the common emitter resistor 17, 27 is maintained constant due to the constant base voltage of transistor 13 so that the direct emitter current of the first IF-transistor 13 decreases as much as the direct emitter current of the second IF-transistor 20 increases due to the control. The gain reduction of the first IF-stage is thus compensated by the gain increase of the second IF-stage so that the total IF-amplification remains substantially constant. Since, furthermore, the voltage applied to the base of the mixing transistor (the voltage across resistor 27) remains constant the total amplification of the circuit during the first phase of the control is not varied so that an optimum signal-to-noise ratio is obtained.

Upon further increase in the strength of the input signal the gain increase in the second IF-transistor is no longer capable of compensating for the resulting gain reduction of the first IF-transistor. Consequently automatic gain control takes place during this second phase of the control. The increase in the direct emitter current of the second transistor is in this connection very important for the distortionless handling of the signal strength which occurs in transistor 20 and which now is already considerable.

When, upon further increasing strength of the input signal, the transistor 13 has been controlled downwards so far that further gain reduction in this transistor is not possible without impermissible signal distortion occurring, the diode 28 is automatically cut off. The first IF-transistor thus no longer takes part in the control process during this third phase of the control. However, the steadily increasing direct emitter current of the second IF-transistor then results in an increase of the voltage across resistor 27 since this voltage is no longer held by the action of transistor 13. This positive going voltage is applied through resistor 30 to the base of mixing transistor 3 thus causing reduction in the conversion gain by upward control of the mixing transistor. During this third phase the automatic gain control thus takes place in the mixing stage, whilst furthermore a low additional gain control is obtained due to the varying input impedance of the second IF-transistor, resulting in poorer matching between the two IF-transistors. In this phase also the increase in direct current of the second IF-transistor is very important not only for handling the great signal strength occurring in this stage without distortion but also because during this phase the said stage must supply a sufficient amount of IF-energy to the detector for providing the required control energy, whilst also the transistor 20 must provide the great control energy needed for the upward control of the mixing transistor.

In the manner above described a circuit is obtained having a very effective gain control and favourable signal-to-noise properties, whilst a minimum of circuit elements is required.

A further improvement is obtained due to the voltage across resistor 27 being applied through resistor 32 to the lower side of the detecting circuit. The voltage increase across the resistor 27 which occurs during the third phase of the control thus adds to the control voltage applied through resistor 34 and inductor 36 to the base of transistor 20, so that for this phase an increase in control amplification is obtained.

The emitter circuit of mixing transistor 3 includes the parallel combination of a high resistor 9 and a Zener diode 10. This Zener diode is cut off during the above-described first and second phase of the control so that the current flow through the mixing transistor is greatly stabilized by the high resistor 9, for example with respect to small voltage variations which may still occur across resistor 27. As soon as the voltage across resistor 27 increases during the third phase of the control the Zener diode 10 reaches the breakdown voltage, thus preventing resistor 9 from causing a strong direct-voltage negative feedback for the control of the mixing stage. A considerable reduction in the control energy required for the mixing transistor thus results.

A circuit built up in practice in accordance with the figure was proportioned as follows:

| | |
|---|---|
| $V_8$—21 volts | $R_{23}$—10KΩ |
| $R_6$—680Ω | $R_{26}$—470Ω |
| $R_7$—100Ω | $R_{27}$—1.5KΩ |
| $R_9$—12KΩ | $R_{30}$—220Ω |
| $R_{14}$—27KΩ | $R_{32}$—6.8KΩ |
| $R_{15}$—18KΩ | $R_{33}$—27KΩ |
| $R_{17}$—150KΩ | $R_{34}$—12KΩ |

What is claimed is:

1. A transistor receiving circuit comprising a first stage, preferably an HF or mixing stage, followed by two intermediate-frequency transistors connected in cascade and then followed by a detector stage from which an automatic gain control voltage is derived which is applied to the second of the said transistors and which also acts on the first transistor through a coupling between the emitter circuits of the said two transistors, characterized in that the polarity of the detector is so chosen that the second of the said transistors is opened further upon increasing signal strength, that the coupling between the emitter circuits of the two transistors includes a diode which is cut off when a prescribed signal strength is exceeded, and that the voltage set up across an emitter resistor of the second transistor is applied to the said first stage for upward control of this stage.

2. A transistor receiving circuit as claimed in claim 1, characterized in that at least part of the direct emitter voltage of the second transistor is applied to the detector stage in such manner that the control amplification of the receiving circuit is increased.

3. A transistor receiving circuit as claimed in claim 1, characterized in that the emitter circuit of the first stage includes the parallel combination of a resistor and a voltage-stabilising element.

4. A transistor receiver circuit comprising first, second and third stages, means connecting said stages in cascade in that order, each of said stages comprising a transistor having emitter, base and collector electrodes, a detector circuit comprising means for deriving a gain control voltage, means for connecting said detector circuit to the output of said third stage, diode means, means connecting said diode means between the emitters of the transistors of said second and third stages, means applying said gain control voltage to the base of the transistor of said third stage whereby the emitter current of said last-mentioned transistor increases with increases in the strength of signals applied to said detector circuit, bias means connected to the emitters of the transistors of said second and third stages whereby said diode means is conductive when said signal strength is below a predetermined level and non-conductive when said signal strength is above said level, and means connecting the emitter of the transistor of said third stage to said first stage whereby the gain of said first stage is controlled only when said signal strength is above said level.

5. A transistor receiver circuit comprising first, second and third stage, comprising first, second and third transistors respectively, each of said transistors having emitter, base and collector electrodes, means interconnecting said stages in cascade in that order, a source of signals connected to said first stage, detector means, means connecting said detector means to said third stage, said detector stage comprising means for producing a gain control voltage dependent upon the strength of signals applied thereto, means applying said gain control voltage to the base of said third transistor whereby the emitter current of said third transistor increases with increases in said signal strength, diode means, means connecting said diode means between the emitters of said second and third transistors, emitter-base bias means for said second and third transistors whereby said diode means is conductive when said signal strength is below a predetermined level and non-conductive when said signal strength is above said level, whereby the emitter voltage of said third transistor is substantially constant when said signal strength is below said level, and means connecting said emitter of said third transistor to the base of said first transistor whereby the gain of said first stage is controlled only when said signal strength is above said level.

6. A gain control system for a transistor receiver of the type having first and second intermediate frequency amplifier stages comprising first and second transistors respectively, means connecting said stages in cascade in that order, a source of signals connected to said first stage, a detector circuit for providing a gain control voltage, and means connecting said detector circuit to said second stage, each of said transistors having emitter, base and collector electrodes, said gain control system comprising means applying said gain control voltage to an electrode, of said second transistor whereby the emitter current of said second transistor and the gain of said second transistor increases with increases in the strength of signals applied to said detector circuit, means providing a substantially constant bias voltage for the base electrode of said first transistor, and means interconnecting the emitter electrodes of said first and second transistors whereby the emitter current and gain of said first transistor decreases as the emitter current of said second transistor increases, so that for low signal strength the decreases of gain of said first transistor substantially equals the increase of gain of said second transistor and for higher signal strength the decrease of gain of said second transistor is greater than the increase of gain of said second transistor.

7. The system of claim 6, wherein said means interconnecting said emitter electrodes comprises diode means.

8. A gain control system for a transistor receiver of the type having first, second and third stages comprising first, second and third transistors respectively, means connecting said stages in cascade in that order, a source of signals connected to said first stage, a detector circuit for providing a gain control voltage, and means connecting said detector circuit to said third stage, each of said transistors having base, emitter and collector electrodes, said gain control system comprising means applying said gain control voltage to an electrode of said third transistor whereby the emitter current and gain of said third transistor increases with increases in the strength of signals applied to said detector circuit, diode means, means connecting said diode means between the emitters of said second and third transistors, bias means for said second and third transistors whereby said diode means is conductive when said signal strength is below a predetermined level so that the gain of said second transistor decreases as the gain of said third transistor increases, and said diode means is non-conductive for signal strengths above said level, and means connecting the emitter of said third transistor to an electrode of said first transistor for controlling the gain of said first transistor, whereby the gain of said first transistor is controlled only when said signal strength is above said level.

9. The system of claim 8, comprising means for adding at least a part of the emitter voltage of said third transistor to said gain control voltage.

10. The system of claim 8, wherein the emitter electrode of said third transistor is connected to the base electrode of said first transistor, comprising a parallel circuit of a resistor and a Zener diode connected in series with the emitter of said first transistor, whereby said Zener diode has a high resistance when said signal strength is below said level and said Zener diode is conductive when said signal strength is above said level.

References Cited

UNITED STATES PATENTS 3,303,428 2/1967 Zentmaier ----------- 330—29

KATHLEEN H. CLAFFY, *Primary Examiner.*

BARRY PAUL SMITH, *Assistant Examiner.*

U.S. Cl. X.R.

325—319, 405; 330—29